US010320358B2

(12) United States Patent
Chai et al.

(10) Patent No.: US 10,320,358 B2
(45) Date of Patent: Jun. 11, 2019

(54) MAGNETICALLY COUPLED CONTACTLESS DAMPER

(71) Applicant: Hamilton Sundstrand Corporation, Charlotte, NC (US)

(72) Inventors: Huazhen Chai, Caledonia, IL (US); Eric A. Carter, Monroe, WI (US); John Huss, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 170 days.

(21) Appl. No.: 15/432,132

(22) Filed: Feb. 14, 2017

(65) Prior Publication Data

US 2018/0234071 A1 Aug. 16, 2018

(51) Int. Cl.
| | |
|---|---|
| H03H 7/06 | (2006.01) |
| H01F 27/23 | (2006.01) |
| H03H 7/42 | (2006.01) |
| H01F 17/06 | (2006.01) |
| H03H 1/00 | (2006.01) |
| H01F 27/24 | (2006.01) |
| H01F 27/28 | (2006.01) |
| H03H 3/00 | (2006.01) |
| H02J 3/01 | (2006.01) |
| H01F 17/00 | (2006.01) |

(52) U.S. Cl.
CPC ............. *H03H 7/06* (2013.01); *H01F 17/062* (2013.01); *H01F 27/24* (2013.01); *H01F 27/2823* (2013.01); *H02J 3/01* (2013.01); *H03H 1/00* (2013.01); *H03H 3/00* (2013.01); *H03H 7/427* (2013.01); *H01F 2017/0093* (2013.01); *H01F 2017/065* (2013.01); *H03H 2001/0035* (2013.01)

(58) Field of Classification Search
CPC ..... H01F 27/24; H01F 27/2823; H03H 7/427; H03H 7/06
USPC ......... 333/177, 181, 185; 336/220, 221, 224
See application file for complete search history.

(56) References Cited

U.S. PATENT DOCUMENTS 1,150,228 A * 8/1915 Howle ..................... G06G 1/04
235/84
4,311,977 A * 1/1982 Owen ..................... H01F 19/02
336/180
(Continued)

FOREIGN PATENT DOCUMENTS

| EP | 0558428 | 9/1993 |
| EP | 1693862 | 8/2006 |

(Continued)

OTHER PUBLICATIONS

EP Application No. 18156722.3 Extended EP Search Report dated Jul. 11, 2018, 9 pages.

*Primary Examiner* — Rakesh B Patel
(74) *Attorney, Agent, or Firm* — Cantor Colburn LLP (57) ABSTRACT

According to an aspect, an inductor damper circuit includes a shared magnetic core, a primary winding, and a secondary winding. The primary winding includes an inductor winding of a first wire gauge wound about the shared magnetic core. The secondary winding includes a resistive damper winding of a second wire gauge that is less than the first wire gauge and wound about the shared magnetic core in contactless magnetic coupling with the primary winding.

20 Claims, 8 Drawing Sheets

(56) References Cited

U.S. PATENT DOCUMENTS

| | | | | |
|---|---|---|---|---|
| 4,383,243 A | * | 5/1983 | Krugel | H02J 13/0041 |
| | | | | 307/3 |
| 4,641,115 A | * | 2/1987 | Bailey | H03H 1/0007 |
| | | | | 323/353 |
| 5,377,652 A | * | 1/1995 | Noble | F02P 3/02 |
| | | | | 123/634 |
| 7,068,005 B2 | | 6/2006 | Baker | |
| 7,091,704 B2 | | 8/2006 | Chou et al. | |
| 7,301,787 B2 | | 11/2007 | Wu et al. | |
| 9,300,197 B2 | | 3/2016 | MacLennan | |
| 2006/0148474 A1 | | 7/2006 | Reddy | |
| 2010/0148904 A1 | | 6/2010 | Xie et al. | |
| 2013/0039105 A1 | | 2/2013 | Rozman et al. | |
| 2014/0375405 A1 | | 12/2014 | Duesterhoeft et al. | |

FOREIGN PATENT DOCUMENTS

| | | |
|---|---|---|
| EP | 1912329 | 4/2008 |
| JP | 2006033113 | 2/2006 |
| WO | 9917016 | 4/1999 |

* cited by examiner

FIG. 16

MAGNETICALLY COUPLED CONTACTLESS DAMPER

BACKGROUND

The present disclosure relates to power filtering circuits, and more specifically, to integration of an inductor and damper for a power filtering circuit.

A basic building block of a power filter is a low pass filter including an inductor (L) and a capacitor (C). This filter can also contain a damper circuit including a capacitor and a damper resistor (R). Prior art damper resistors use off-the-shelf resistors that may be either thick film or metal foil resistors. Resistor failures have been a leading cause for failures of various motor controllers during production processes. The prime causes of resistor failures are due to the fragile ceramic base and low pulse power capability of the resistor element.

Conventional wire wound resistors are generally large and bulky. A package style that includes separate wire wound resistors would require a wire harness and supports that increase production time and cost significantly, and also may reduce overall reliability. Additionally, a cold plate may be needed to provide a heat drain path from a printed wiring board mounted resistor element as the damper resistor.

BRIEF DESCRIPTION

According to one embodiment an inductor damper circuit includes a shared magnetic core, a primary winding, and a secondary winding. The primary winding includes an inductor winding of a first wire gauge wound about the shared magnetic core. The secondary winding includes a resistive damper winding of a second wire gauge that is less than the first wire gauge and wound about the shared magnetic core in contactless magnetic coupling with the primary winding.

In addition to one or more of the features described above, or as an alternative, further embodiments may include where the shared magnetic core is a toroid.

In addition to one or more of the features described above, or as an alternative, further embodiments may include where the secondary winding is wrapped with an insulating material, and the primary winding is wrapped over the insulating material.

In addition to one or more of the features described above, or as an alternative, further embodiments may include where the primary winding is a copper winding, and the resistive damper winding is a resistive alloy.

In addition to one or more of the features described above, or as an alternative, further embodiments may include where the secondary winding includes one or more electrically shorted windings comprising one or more turns.

In addition to one or more of the features described above, or as an alternative, further embodiments may include where the secondary winding includes at least one bifilar turn to provide resistance trimming for the one or more turns of the secondary winding.

In addition to one or more of the features described above, or as an alternative, further embodiments may include where a number of the one or more turns is based on a turns ratio with respect to a number of turns of the primary winding and a targeted reflected resistance of the secondary winding at the primary winding to achieve a targeted frequency response of the damper filter.

According to an embodiment, a power filtering circuit of a multi-phase electrical machine is provided. The power filtering circuit includes a plurality of power phases, each of the power phases including a damper filter coupled to a power input and a power output. The damper filter includes an inductor damper circuit coupled to a capacitor. The inductor damper circuit includes a shared magnetic core, a primary winding, and a secondary winding. The primary winding includes an inductor winding of a first wire gauge wound about the shared magnetic core. The secondary winding includes a resistive damper winding of a second wire gauge that is less than the first wire gauge and wound about the shared magnetic core in contactless magnetic coupling with the primary winding.

In addition to one or more of the features described above, or as an alternative, further embodiments may include where the shared magnetic core is a toroid, the secondary winding is a resistive alloy wrapped with an insulating material, and the primary winding is a copper winding wrapped over the insulating material.

According to another embodiment, a method includes coupling an input lead of a primary winding of a damper filter to a power input and coupling an output lead of the primary winding of the damper filter to a power output. A contactless magnetic coupling is established between the primary winding and a secondary winding wound about a shared magnetic core of an inductor in the damper filter. The primary winding includes an inductor winding of a first wire gauge, and the secondary winding includes a resistive damper winding of a second wire gauge that is less than the first wire gauge and operable to provide electrical damping between the power input and the power output.

In addition to one or more of the features described above, or as an alternative, further embodiments may include coupling at least one instance of the damper filter to each of a plurality of power phases in a multi-phase electrical machine.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

A detailed description of one or more embodiments of the disclosed apparatus and method are presented herein by way of exemplification and not limitation with reference to the Figures.

In embodiments, a damper circuit is achieved by adding one or more shorted resistive windings that are magnetically coupled to a primary winding of an inductor of a damper filter for a power filtering circuit. There are no physical electrical connections between the damper circuit and other elements of the power filtering circuit. Damper power is uniformly generated and distributed along the filter inductor body. Thus, there is no need for a damper circuit component in a printed wiring board (PWB) onto which the inductor is mounted and no need to provide separate cooling for separate damper resistors on the PWB, which can greatly simplify packaging requirements. Pulse power capability can also be increased by several orders of magnitude, which further improves reliability.

According to one or more embodiments, an inductor damper circuit includes a primary winding in contactless magnetically coupling with a secondary winding. The secondary winding can be made of one or more shorted damper windings of a resistive alloy wire. The resistive alloy wire gauge is significantly smaller than the main inductor copper wires of the primary winding such that the addition of the secondary winding may not noticeably change inductor size, weight and performance. The secondary winding can create a damper circuit within an inductor of the damper filter through magnetic coupling and dissipating resonant energy within the inductor. Therefore, component count, manufacturing and test costs can be reduced while overall reliability increases.

Figure 1:
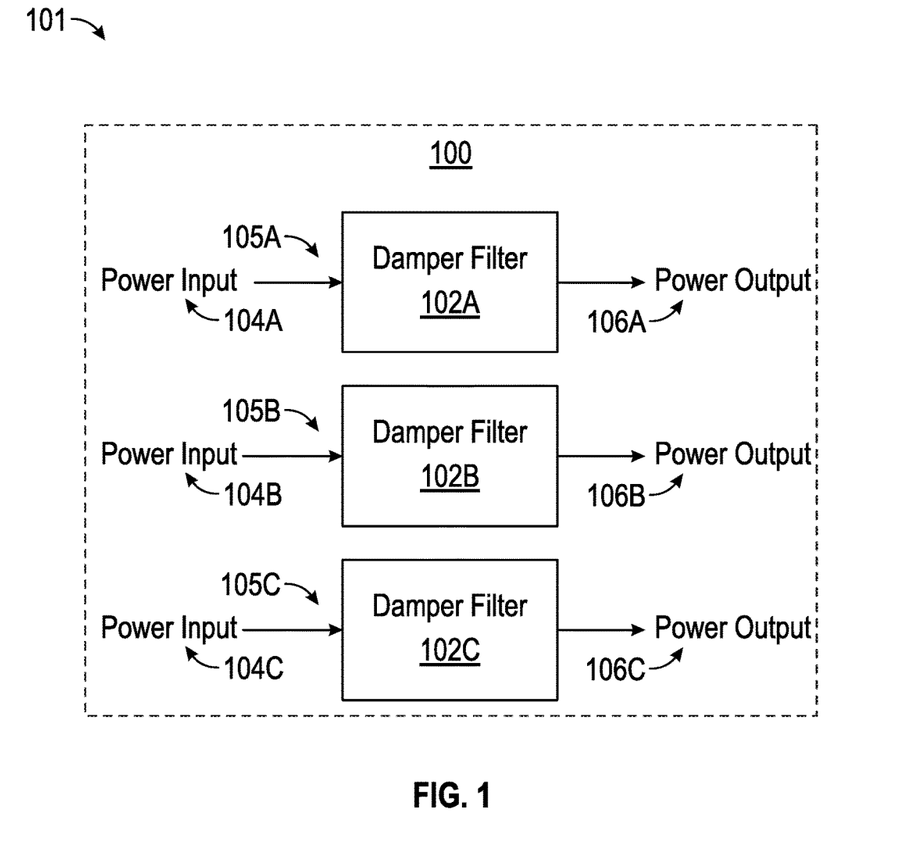
FIG. 1 depicts a power filtering circuit of a multi-phase electrical machine according to an embodiment.

Turning to FIG. 1, an example of a power filtering circuit 100 of a multi-phase electrical machine 101 is depicted according to an embodiment. The multi-phase electrical machine 101 can be any power electronics device or system, such as a power supply, motor control, power converter, or the like. The power filtering circuit 100 can provide harmonic filtering and/or electromagnetic interference filtering for a plurality of electrical power phases of the multi-phase electrical machine 101. In the example of FIG. 1, there are three power phases 105A, 105B, 105C that each includes a respective damper filter coupled to a power input and a power output. For instance, power phase 105A includes damper filter 102A that outputs filtered power at power output 106A responsive to the power input 104A and filtering characteristics of the damper filter 102A. Similarly, power phase 105B includes damper filter 102B that outputs filtered power at power output 106B responsive to the power input 104B and filtering characteristics of the damper filter 102B. The power phase 105C includes damper filter 102C that outputs filtered power at power output 106C responsive to the power input 104C and filtering characteristics of the damper filter 102C. Although damper filters 102A-102C are separately depicted, there can be shared connections, such as a common neutral line between one or more of the damper filters 102A-102C. Each of the damper filters 102A-102C can include at least one inductor damper circuit and one or more filtering elements as further described herein. Although the example of FIG. 1 includes three damper filters 102A-102C, other embodiments may include a greater or lesser number of damper filters 102A-102C, e.g., at least one damper filter.

Figure 2:
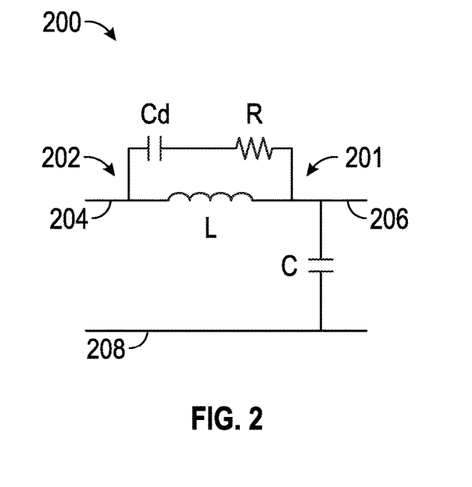
FIG. 2 depicts a damper filter circuit model.

FIG. 2 depicts a damper filter circuit model 200 as an example filter topology for comparison to embodiments. The damper filter circuit model 200 includes a filter circuit 201 and a damper circuit 202. The filter circuit 201 includes an inductor L between an input lead 204 and an output lead 206. The inductor L is connected in series with a capacitor C between the output lead 206 and a neutral lead 208. The damper circuit 202 is connected in parallel with the inductor L and includes a damper capacitor Cd connected in series with a damper resistor R.

Figure 3:
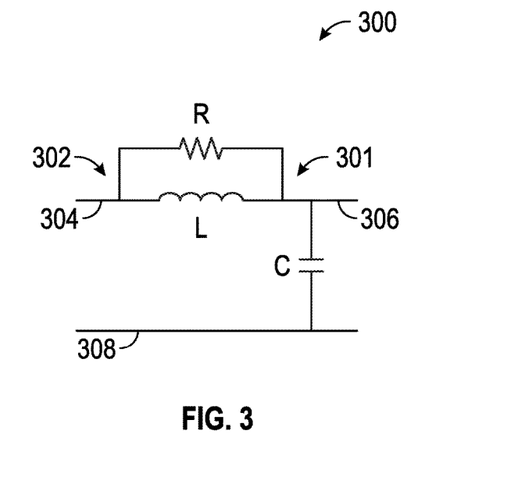
FIG. 3 depicts another damper filter circuit model.

FIG. 3 depicts a damper filter circuit model 300 as another example filter topology for comparison to embodiments. The damper filter circuit model 300 includes a filter circuit 301 and a damper circuit 302. The filter circuit 301 includes an inductor L between an input lead 304 and an output lead 306. The inductor L is connected in series with a capacitor C between the output lead 306 and a neutral lead 308. The damper circuit 302 is connected in parallel with the inductor L and includes only a damper resistor R absent the damper capacitor Cd of FIG. 2.

Figure 4:
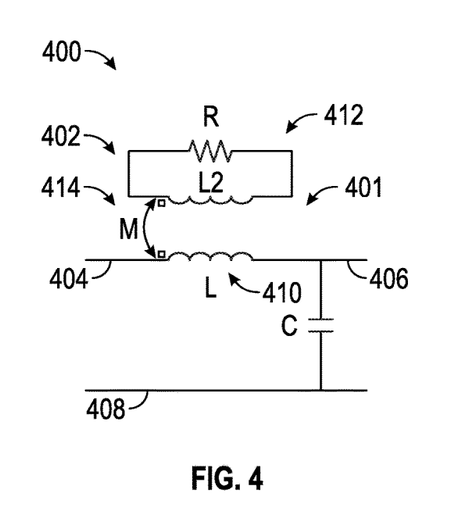
FIG. 4 depicts a damper filter circuit according to an embodiment.

FIG. 4 depicts a damper filter 400 as an embodiment of one or more of the damper filters 102A-102C of FIG. 1. The damper filter 400 includes a filter circuit 401 and a damper circuit 402. The filter circuit 401 includes an inductor L between an input lead 404 and an output lead 406. The input lead 404 may be coupled to a power input, such as one of the power inputs 104A-104C of FIG. 1, and the output lead 406 may be coupled to a corresponding power output, such as one of the power outputs 106A-106C of FIG. 1. The inductor L is connected in series with a capacitor C between the output lead 406 and a neutral lead 408. The damper circuit 402 is magnetically coupled in parallel with a primary winding 410 of the inductor L absent physical contact between the damper circuit 402 and the primary winding 410. The damper circuit 402 includes a secondary winding 412 that acts as a damper resistor R in series with a secondary inductor L2. The primary winding 410 is an inductor winding of a first wire gauge and may be formed of a low resistance wire such as copper. In contrast, the secondary winding 412 is a resistive damper winding of a second wire gauge that is less than the first wire gauge. The secondary winding 412 can be a resistive alloy that has a higher resistance characteristic per unit distance than the primary winding 410. By turning the secondary winding 412 about a magnetic core, the secondary winding 412 exhibits properties of both an inductor (L2) and a resistor (R). Together, the primary winding 410 of the inductor L and the secondary winding 412 wrapped about a shared magnetic core form an inductor damper circuit 414.

The primary winding 410 and the secondary winding 412 do not physically contact each other even though they can both be wound about a shared magnetic core. Contactless magnetic coupling can be achieved, for example, by forming one or more turns of the secondary winding 412 as one or more electrically shorted windings, wrapping the secondary winding 412 with an insulating material, and wrapping the primary winding 410 over the insulating material.

Figure 5:
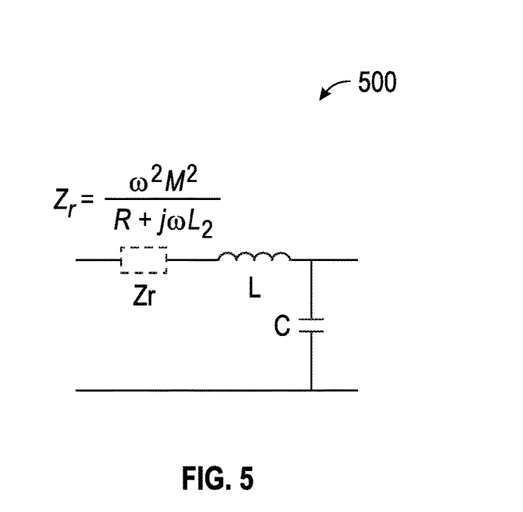
FIG. 5 depicts an equivalent damper filter circuit as a reflected impedance according to an embodiment.

The effect of the secondary winding 412 on the primary winding 410 can appear as a reflected impedance ($Z_r$) according to the following equation.

$$Z_r = \frac{\omega^2 M^2}{R + j\omega L_2},$$

where $M = k\sqrt{L_1 L_2}$ is the mutual inductance, and k is a coupling coefficient. This is depicted schematically in FIG. 5, where damper filter 500 is an analytical equivalent to the damper filter 400 of FIG. 4 with reflected impedance $Z_r$ in series with inductor L.

Figure 6:
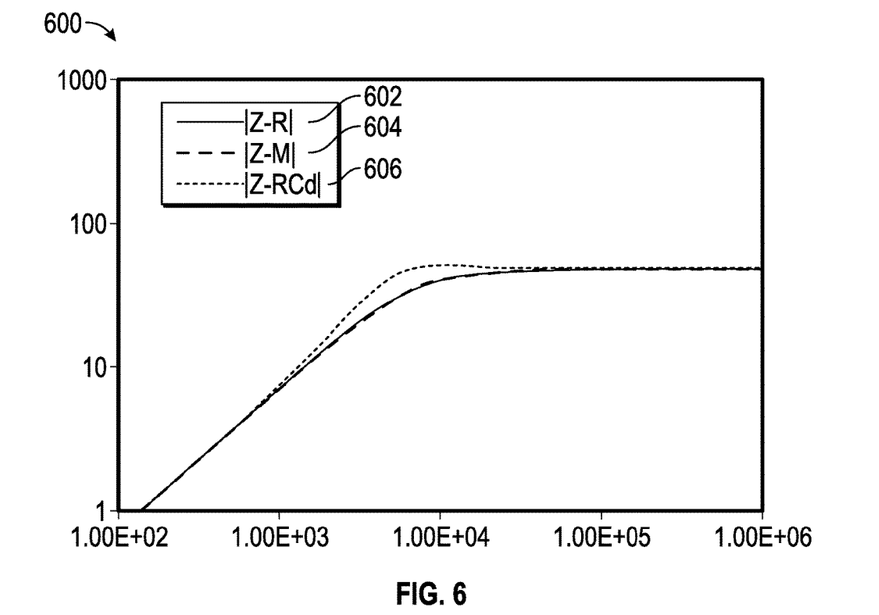
FIG. 6 depicts a plot according to an embodiment.

FIG. 6 is a plot 600 that compares the input impedances of the damper filter circuit model 300 of FIG. 3 as response 602, damper filter 500 of FIG. 5 as response 604, and damper filter circuit model 200 of FIG. 2 as response 606. The response 604 indicates that with near perfect coupling (k=1) between the primary winding 410 and the secondary winding 412 of FIG. 4, the damper filter 500 response 604 substantially aligns with response 602 of the damper filter circuit model 300 of FIG. 3.

Figure 7:
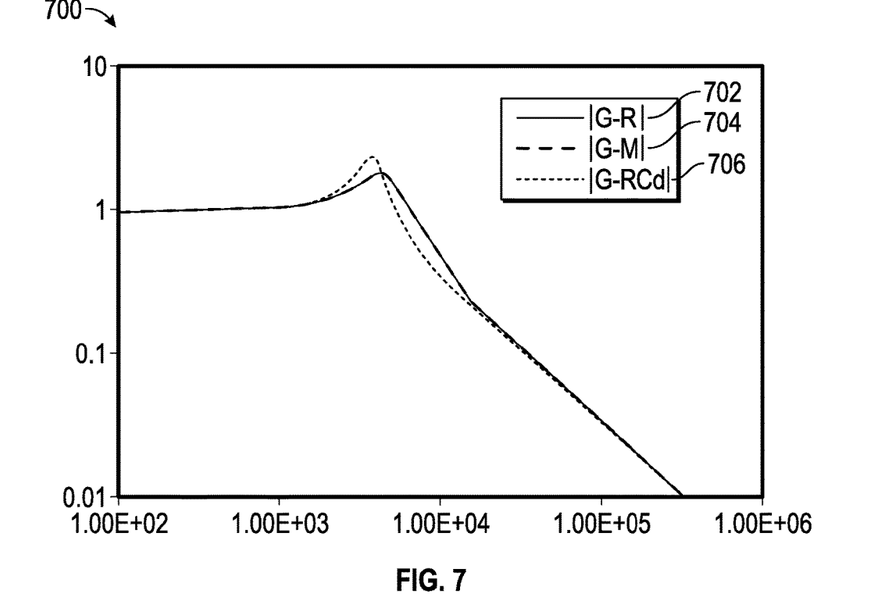
FIG. 7 depicts a plot according to an embodiment.

Similar results are noted with respect to FIG. 7 on plot 700 that compares voltage transfer functions of the damper filter circuit model 300 of FIG. 3 as response 702, damper filter 500 of FIG. 5 as response 704, and damper filter circuit model 200 of FIG. 2 as response 706. The response 704 indicates that with near perfect coupling (k=1) between the primary winding 410 and the secondary winding 412 of FIG. 4, the damper filter 500 response 704 substantially aligns with response 702 of the damper filter circuit model 300 of FIG. 3.

Figure 8:
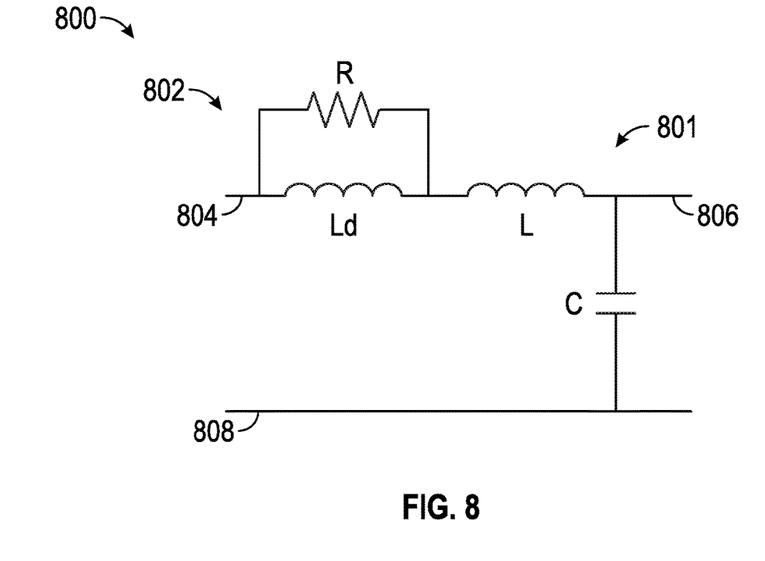
FIG. 8 depicts another damper filter circuit model.
Figure 9:
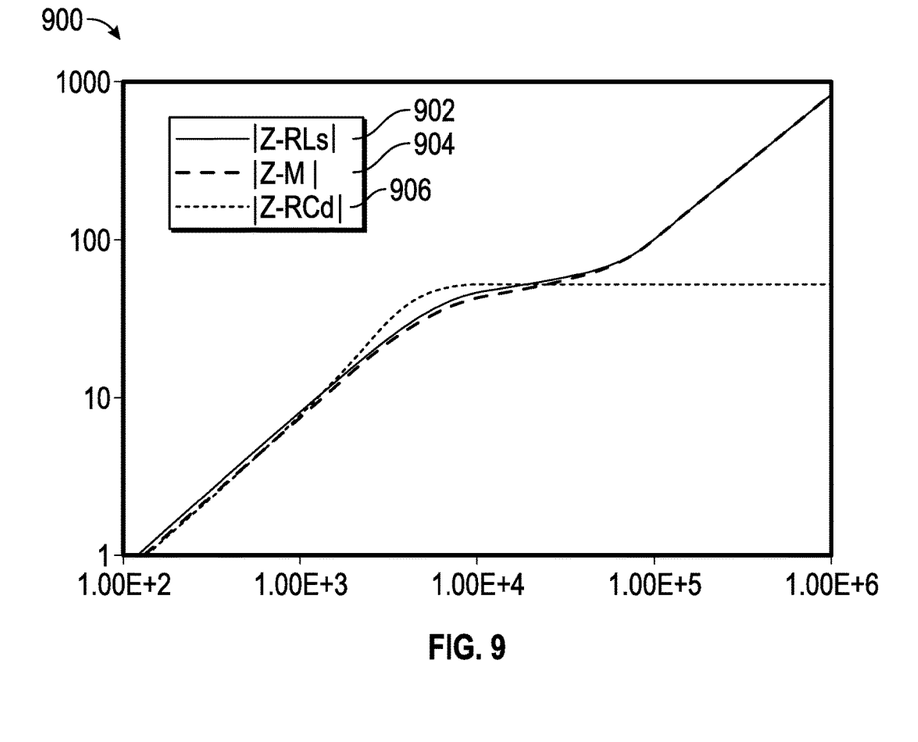
FIG. 9 depicts a plot according to an embodiment.
Figure 10:
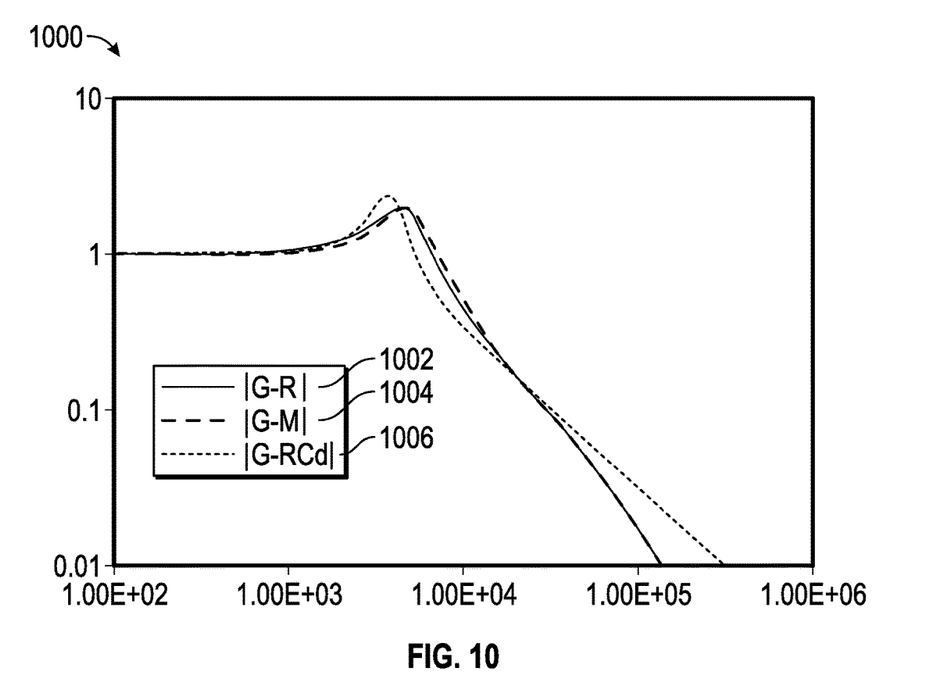
FIG. 10 depicts a plot according to an embodiment.

When coupling between the primary winding 410 and the secondary winding 412 of FIG. 4 is diminished (k<<1), the damper filter 500 of FIG. 5 may appear to align with damper filter circuit model 800 of FIG. 8 as illustrated in the examples of FIGS. 9 and 10. The damper filter circuit model 800 includes a filter circuit 801 and a damper circuit 802. The filter circuit 801 includes a damper inductor Ld in series with an inductor L between an input lead 804 and an output lead 806. The inductor L is connected in series with a capacitor C between the output lead 806 and a neutral lead 808. The damper circuit 802 includes a damper resistor R in parallel with the damper inductor Ld. The damper inductor Ld models a leakage impedance inserted into inductor L.

FIG. 9 is a plot 900 that compares the input impedances of the damper filter circuit model 800 of FIG. 8 as response 902, damper filter 500 of FIG. 5 as response 904, and damper filter circuit model 200 of FIG. 2 as response 906. The response 904 indicates that with lower coupling (k<<1) between the primary winding 410 and the secondary winding 412 of FIG. 4, the damper filter 500 response 904 substantially aligns with response 902 of the damper filter circuit model 800 of FIG. 8.

Similar results are noted with respect to FIG. 10 on plot 1000 that compares voltage transfer functions of the damper filter circuit model 800 of FIG. 8 as response 1002, damper filter 500 of FIG. 5 as response 1004, and damper filter circuit model 200 of FIG. 2 as response 1006. The response 1004 indicates that with lower coupling (k<<1) between the primary winding 410 and the secondary winding 412 of FIG. 4, the damper filter 500 response 1004 substantially aligns with response 1002 of the damper filter circuit model 800 of FIG. 8.

Figure 11:
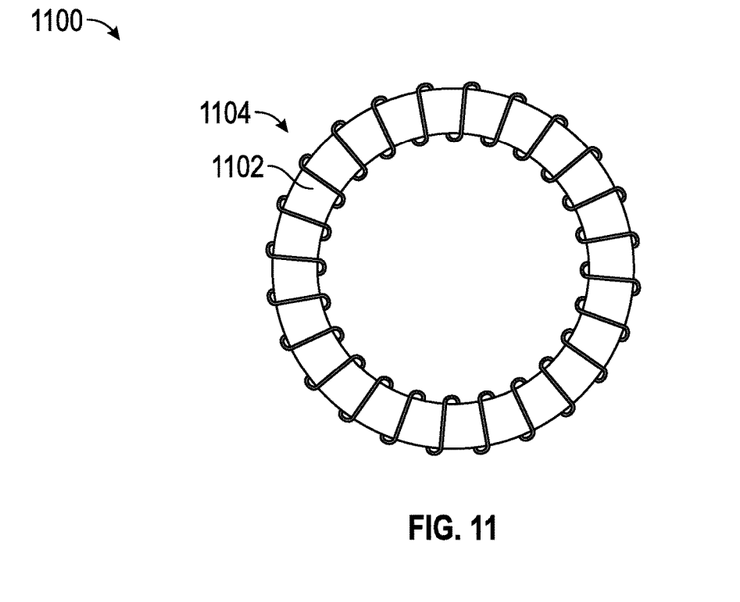
FIG. 11 depicts a toroid wrapped according to one embodiment.

The number of turns needed for the secondary winding 412 of FIG. 4 to achieve a required damper resistance RO reflected to the primary winding 410 of FIG. 4 can be determined analytically. The actual secondary resistance is proportional to number of secondary turns, and the inductance L2 is proportional to secondary turns squared. The secondary resistance R and a design target reflected RO can be plotted to determine a turns ratio. A crossing point of the two lines gives the turns ratio that would produce a reflected resistance R0 to the inductor primary side. Once a damper winding wire gauge, resistivity and turns (for example, 67 turns) are determined, the resistive alloy wire can be wound uniformly along a shared magnetic core 1102 as a single winding 1104, for instance making 67 turns, with the beginning and end shorted as depicted in the example inductor damper circuit 1100 of FIG. 11, where the shared magnetic core 1102 is a toroid, and a primary winding is not depicted in this example.

Figure 12:
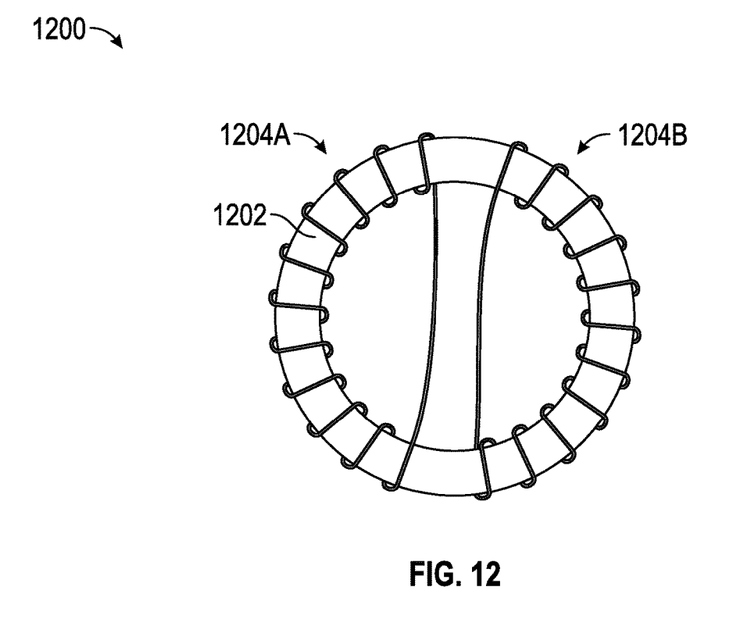
FIG. 12 depicts a toroid wrapped according to one embodiment.
Figure 13:
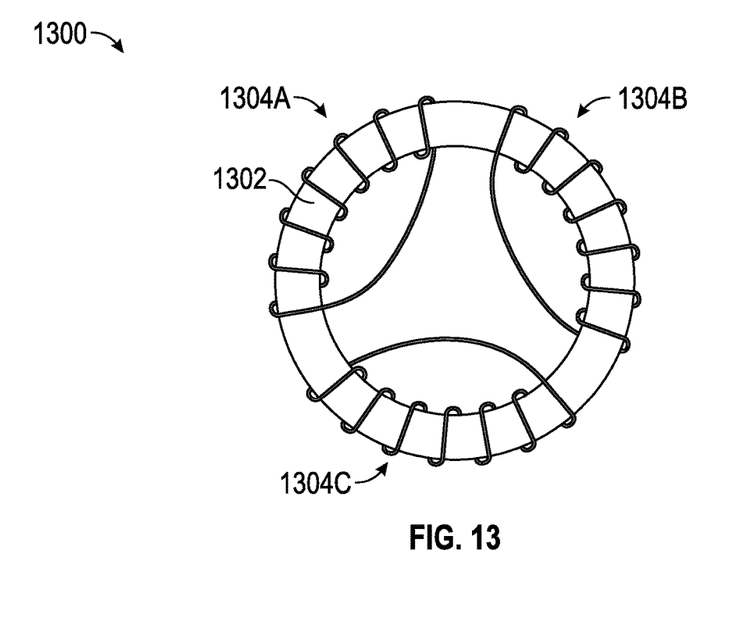
FIG. 13 depicts a toroid wrapped according to one embodiment.

Numerous other winding combinations can be supported to provide a similar secondary resistance R. As depicted in the example of FIG. 12, an inductor damper circuit 1200 can be formed using two shorted windings 1204A, 1204B of resistive alloy wire each having 33 turns and occupying about half of the shared magnetic core 1202. As another example, in FIG. 13, an inductor damper circuit 1300 can be formed using three shorted windings 1304A, 1304B, 1304C of resistive alloy wire each with 22 turns and occupying about one third of the shared magnetic core 1302.

Figure 14:
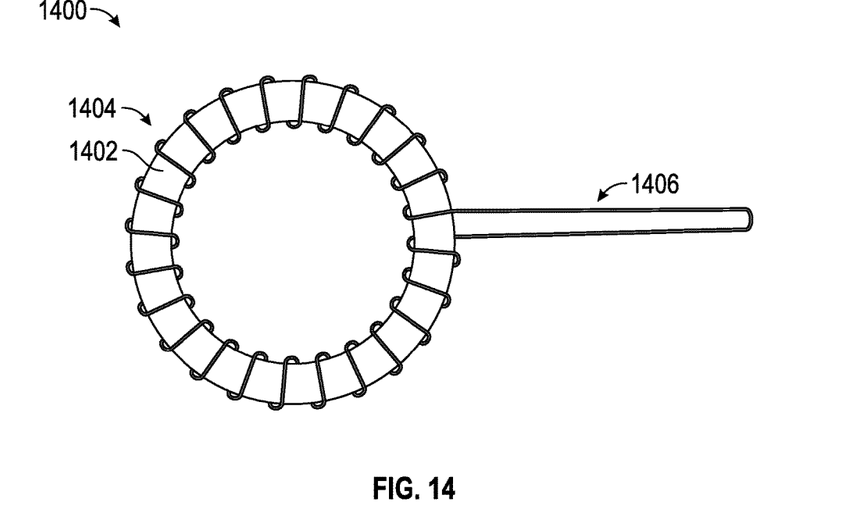
FIG. 14 depicts a toroid wrapped according to one embodiment.

There can be many variations to achieve the same end result. For instance, at the extreme, 67 individual shorted windings of resistive alloy wire—each with only one turn—could be used, where each turn takes up only one 67th or less of the core length. As a further option, one of the many variations is to have a number of turns of resistive windings 1404 about a shared magnetic core 1402 plus one or more bifilar turns 1406 for resistance trimming, as shown in the inductor damper circuit 1400 of FIG. 14. Bifilar turns 1406 can add resistance by using an extended length of resistive alloy wire per turn.

Figure 15:
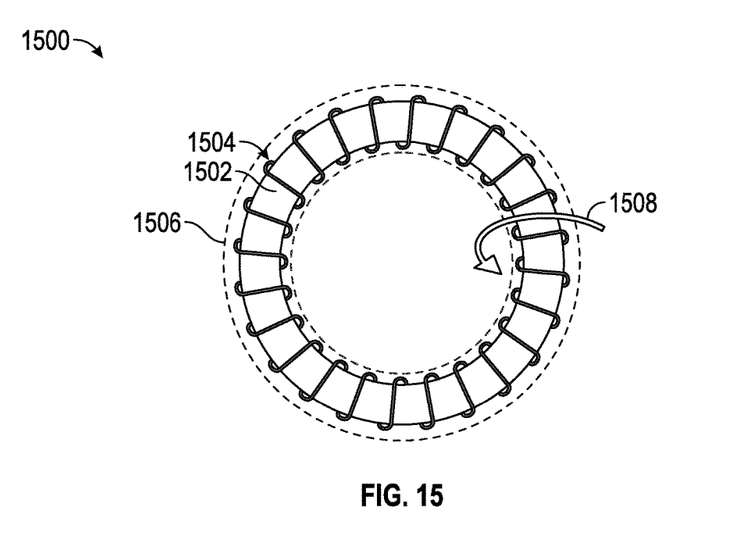
FIG. 15 depicts another toroid wrapped according to one embodiment.

FIG. 15 illustrates an inductor damper circuit 1500 including a shared magnetic core 1502 that is a toroid. A secondary winding 1504 is wound a desired number of turns around the shared magnetic core 1502. The secondary winding 1504 is wrapped with an insulating material 1506, such as Mylar tape. A primary winding 1508 is wrapped over the insulating material 1506. The combined windings 1504, 1508 and insulating material 1506 establish a contactless magnetic coupling between the primary winding 1508 and the secondary winding 1504 wound about the shared magnetic core 1502 of the inductor damper circuit 1500, which can act as inductor L, secondary inductor L2, and damper resistor R of FIG. 4.

Figure 16:
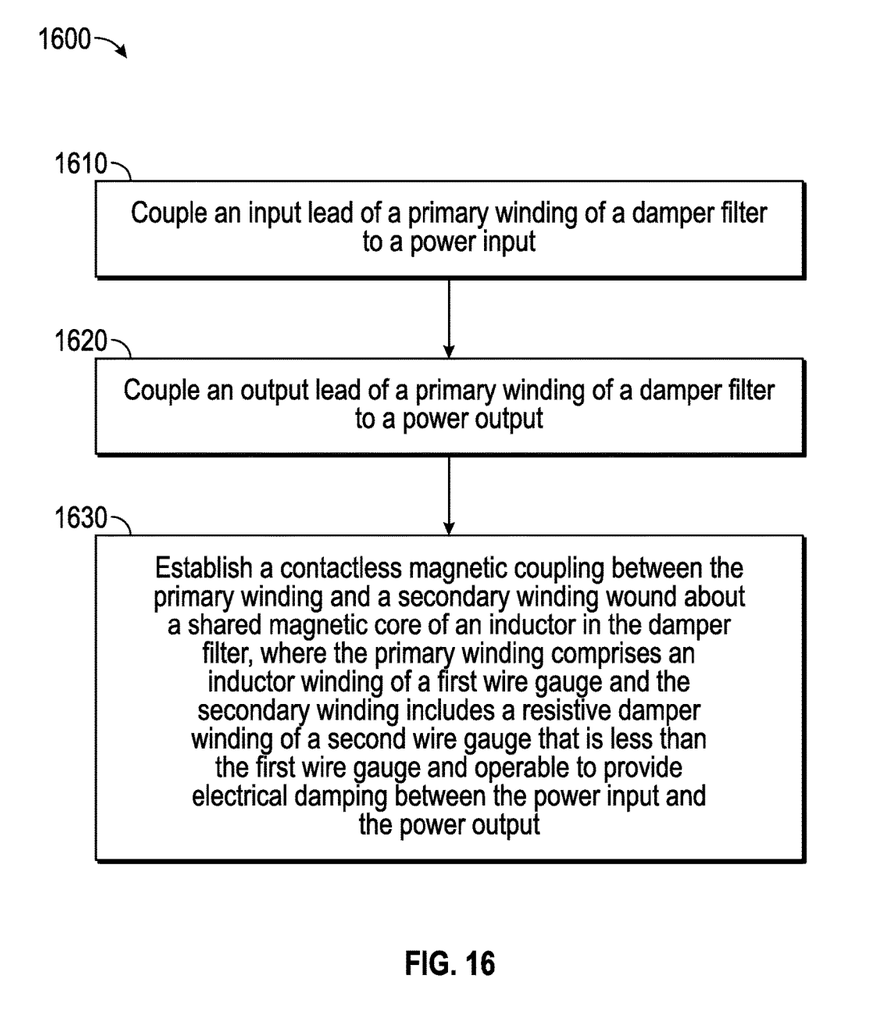
FIG. 16 depicts a process according to an embodiment.

FIG. 16 illustrates a flow chart of a method 1600 in accordance with one or more embodiments. Although the blocks of method 1600 are presented in a particular order, it will be understood that the blocks can be arranged in an alternate order and/or additional or fewer steps may be incorporated in method 1600 in accordance with embodiments. The method 1600 is described in further reference to FIGS. 1-15.

At block 1610, an input lead of a primary winding of a damper filter is coupled to a power input. For instance, input lead 404 of damper filter 400 can be coupled to power input 104A.

At block 1620, an output lead of the primary winding of the damper filter is coupled to a power output. For instance, output lead 406 of damper filter 400 can be coupled to power output 106A.

At block 1630, a contactless magnetic coupling is established between the primary winding and a secondary winding wound about a shared magnetic core of an inductor in the damper filter, where the primary winding is an inductor winding of a first wire gauge and the secondary winding is a resistive damper winding of a second wire gauge that is less than the first wire gauge and operable to provide electrical damping between the power input and the power output. For instance, the primary winding 410 and secondary winding 412 can both be wrapped around shared magnetic core 1102, 1202, 1302, 1402, or 1502. As previously described the shared magnetic core can be a toroid. The secondary winding can be wrapped with an insulating material (e.g., insulating material 1506), and the primary winding can be wrapped over the insulating material. The primary winding can be a copper winding, and the resistive damper winding can be a resistive alloy, for example. The secondary winding can include one or more electrically shorted windings with one or more turns. The secondary winding can include at least one bifilar turn (e.g., one or more of the bifilar turns 1406) to provide resistance trimming for the one or more turns of the secondary winding. A number of the one or more turns can be based on a turns ratio with respect to a number of turns of the primary winding and a targeted reflected resistance of the secondary winding at the primary winding to achieve a targeted frequency response of the damper filter. At least one instance of the damper filter can be coupled to each of a plurality of power phases in a multi-phase electrical machine, as depicted in the example of FIG. 1.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof.

Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An inductor damper circuit comprising:
   a shared magnetic core;
   a primary winding comprising an inductor winding of a first wire gauge wound about the shared magnetic core; and
   a secondary winding comprising a resistive damper winding of a second wire gauge that is less than the first wire gauge and wound about the shared magnetic core in contactless magnetic coupling with the primary winding, and the resistive damper winding comprises a resistive alloy that has a higher resistance characteristic per unit distance than the primary winding.

2. The inductor damper circuit of claim 1, wherein the shared magnetic core is a toroid.

3. The inductor damper circuit of claim 2, wherein the secondary winding is wrapped with an insulating material, and the primary winding is wrapped over the insulating material.

4. The inductor damper circuit of claim 1, wherein the primary winding is a copper winding.

5. The inductor damper circuit of claim 1, wherein the secondary winding comprises one or more electrically shorted windings comprising one or more turns.

6. The inductor damper circuit of claim 5, wherein the secondary winding comprises at least one bifilar turn to provide resistance trimming for the one or more turns of the secondary winding.

7. The inductor damper circuit of claim 5, wherein a number of the one or more turns is based on a turns ratio with respect to a number of turns of the primary winding and a targeted reflected resistance of the secondary winding at the primary winding to achieve a targeted frequency response of the damper filter.

8. A power filtering circuit of a multi-phase electrical machine, the power filtering circuit comprising:
   a plurality of power phases, each of the power phases comprising a damper filter coupled to a power input and a power output, wherein the damper filter comprises an inductor damper circuit coupled to a capacitor, the inductor damper circuit comprising:
   a shared magnetic core;
   a primary winding comprising an inductor winding of a first wire gauge wound about the shared magnetic core; and
   a secondary winding comprising a resistive damper winding of a second wire gauge that is less than the first wire gauge and wound about the shared magnetic core in contactless magnetic coupling with the primary winding, and the resistive damper winding comprises a resistive alloy that has a higher resistance characteristic per unit distance than the primary winding.

9. The power filtering circuit of claim 8, wherein the shared magnetic core is a toroid, the secondary winding is wrapped with an insulating material, and the primary winding is a copper winding wrapped over the insulating material.

10. The power filtering circuit of claim 8, wherein the secondary winding comprises one or more electrically shorted windings comprising one or more turns.

11. The power filtering circuit of claim 10, wherein the secondary winding comprises at least one bifilar turn to provide resistance trimming for the one or more turns of the secondary winding.

12. The power filtering circuit of claim 10, wherein a number of the one or more turns is based on a turns ratio with respect to a number of turns of the primary winding and a targeted reflected resistance of the secondary winding at the primary winding to achieve a targeted frequency response of the damper filter.

13. A method comprising:
coupling an input lead of a primary winding of a damper filter to a power input;
coupling an output lead of the primary winding of the damper filter to a power output; and
establishing a contactless magnetic coupling between the primary winding and a secondary winding wound about a shared magnetic core of an inductor in the damper filter, wherein the primary winding comprises an inductor winding of a first wire gauge and the secondary winding comprises a resistive damper winding of a second wire gauge that is less than the first wire gauge and operable to provide electrical damping between the power input and the power output, and the resistive damper winding comprises a resistive alloy that has a higher resistance characteristic per unit distance than the primary winding.

14. The method of claim 13, wherein the shared magnetic core is a toroid.

15. The method of claim 14, wherein the secondary winding is wrapped with an insulating material, and the primary winding is wrapped over the insulating material.

16. The method of claim 13, wherein the primary winding is a copper winding.

17. The method of claim 13, wherein the secondary winding comprises one or more electrically shorted windings comprising one or more turns.

18. The method of claim 17, wherein the secondary winding comprises at least one bifilar turn to provide resistance trimming for the one or more turns of the secondary winding.

19. The method of claim 17, wherein a number of the one or more turns is based on a turns ratio with respect to a number of turns of the primary winding and a targeted reflected resistance of the secondary winding at the primary winding to achieve a targeted frequency response of the damper filter.

20. The method of claim 13, further comprising:
coupling at least one instance of the damper filter to each of a plurality of power phases in a multi-phase electrical machine.

* * * * *